(12) United States Patent
Yeh

(10) Patent No.: US 10,872,656 B1
(45) Date of Patent: Dec. 22, 2020

(54) DATA WRITING METHOD, MEMORY CONTROL CIRCUIT UNIT AND MEMORY STORAGE DEVICE

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/527,056

(22) Filed: Jul. 31, 2019

(30) Foreign Application Priority Data

Jun. 10, 2019 (TW) .............................. 108119883 A

(51) Int. Cl.
*G11C 11/409* (2006.01)
*G06F 12/02* (2006.01)
*G06F 3/06* (2006.01)

(52) U.S. Cl.
CPC .......... *G11C 11/409* (2013.01); *G06F 3/0608* (2013.01); *G06F 3/0652* (2013.01); *G06F 3/0679* (2013.01); *G06F 12/0246* (2013.01); *G06F 2212/7205* (2013.01); *G06F 2212/7211* (2013.01)

(58) Field of Classification Search
CPC . G11C 11/409; G06F 3/0652; G06F 12/0246; G06F 3/0608; G06F 3/0679; G06F 2212/7211; G06F 2212/7205

USPC ................................................... 365/189.011
See application file for complete search history.

(56) References Cited

U.S. PATENT DOCUMENTS

| 9,547,589 | B2 * | 1/2017 | Yu ........................ G06F 13/1694 |
| 2019/0087328 | A1 * | 3/2019 | Kanno ................ G06F 12/0261 |
| 2019/0189193 | A1 * | 6/2019 | Kim ..................... G06F 3/0634 |

FOREIGN PATENT DOCUMENTS

| TW | 201908957 | 3/2019 |
| TW | 201913353 | 4/2019 |

OTHER PUBLICATIONS

"Office Action of Taiwan Counterpart Application", dated Aug. 6, 2020, p. 1-p. 8.

* cited by examiner

*Primary Examiner* — Fernando Hidalgo
(74) *Attorney, Agent, or Firm* — JCIPRNET

(57) ABSTRACT

A data writing method, a memory control circuit unit, and a memory storage device are provided. The method includes: writing a first data and a second data to a first physical erasing unit; copying the first data from the first physical erasing unit to a second physical erasing unit; and copying the second data from the first physical erasing unit to a third physical erasing unit, wherein the memory sub-module to which the second physical erasing unit belongs is different from the memory sub-module to which the third physical erasing unit belongs.

18 Claims, 7 Drawing Sheets

DATA WRITING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 108119883, filed on Jun. 10, 2019. The entirety of the above-mentioned patent application is hereby incorporated by reference herein and made a part of this specification.

BACKGROUND

Technical Field

The present invention relates to a data writing method, a memory control circuit unit, and a memory storage device.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In general, the rewritable non-volatile memory module can include multiple memory sub-modules. Each of the memory sub-modules has a plurality of word lines, and memory cells on each of the word lines can form a plurality of physical pages for storing data. Multiple physical pages formed by memory cells on the same word line is also referred to as a physical page group.

In general, if multiple memory sub-modules are to be simultaneously written, a buffer memory needs more space to store data from a host system. For example, if the rewritable non-volatile memory module supports simultaneously (or in parallel) writing of three memory sub-modules, the buffer memory needs a space with the size of three physical page groups. When the data from the host system fills the space with the size of three physical page groups in the buffer memory, the memory management circuit may simultaneously write the data, which comes from the host system, from the buffer memory to the three memory sub-modules. Assuming that the data is to be read, the memory management circuit can simultaneously (or in parallel) read the data from the three memory sub-modules. However, based on the reason that multiple memory sub-modules are to be simultaneously written, the above-mentioned method requires a lot of space of the buffer memory.

SUMMARY

A data writing method, a memory control circuit unit and a memory storage device of the present invention can reduce the space required for the buffer memory, and the technical effect of reading data in a plurality of memory sub-modules in parallel can be retained.

A data writing method for a rewritable non-volatile memory module is provided. The rewritable non-volatile memory module includes a plurality of memory sub-modules, each of the plurality of memory sub-modules includes a plurality of physical erasing units. The data writing method includes: obtaining a plurality of data from a host system and temporarily storing the plurality of data in a buffer memory; writing a first data and a second data of the plurality of data temporarily stored in the buffer memory to a first physical erasing unit of the plurality of memory sub-modules; copying the first data to a second physical erasing unit from the first physical erasing unit; and copying the second data to a third physical erasing unit from the first physical erasing unit, wherein the memory sub-module to which the second physical erasing unit belongs is different from the memory sub-module to which the third physical erasing unit belongs.

A memory control circuit unit for controlling a rewritable non-volatile memory module is provided. The rewritable non-volatile memory module includes a plurality of memory sub-modules, each of the plurality of memory sub-modules includes a plurality of physical erasing units. The memory control circuit unit includes a host interface, a memory interface and a memory management circuit. The host interface is configured to couple to a host system. The memory interface is configured to couple to the rewritable non-volatile memory module, and the plurality of memory sub-modules are respectively coupled to the memory interface. The memory management circuit is coupled to the host interface and the memory interface. The memory management circuit is configured to perform the following operations: obtaining a plurality of data from the host system and temporarily storing the plurality of data in a buffer memory; writing a first data and a second data of the plurality of data temporarily stored in the buffer memory to a first physical erasing unit of the plurality of memory sub-modules; copying the first data to a second physical erasing unit from the first physical erasing unit; and copying the second data to a third physical erasing unit from the first physical erasing unit, wherein the memory sub-module to which the second physical erasing unit belongs is different from the memory sub-module to which the third physical erasing unit belongs.

A memory storage device is provided. The memory storage device includes a connection interface unit, a rewritable non-volatile memory module and a memory control circuit unit. The connection interface unit is configured to couple to a host system. The rewritable non-volatile memory module includes a plurality of memory sub-modules, each of the plurality of memory sub-modules includes a plurality of physical erasing units. The memory control circuit unit is coupled to the connection interface unit and the rewritable non-volatile memory module, and the plurality of memory sub-modules respectively coupled to the memory control circuit unit. The memory control circuit unit is configured to perform the following operations: obtaining a plurality of data from the host system and temporarily storing the plurality of data in a buffer memory; writing a first data and a second data of the plurality of data temporarily stored in the buffer memory to a first physical erasing unit of the plurality of memory sub-modules; copying the first data to a second physical erasing unit from the first physical erasing unit; and copying the second data to a third physical erasing unit from the first physical erasing unit, wherein the memory sub-module to which the second physical erasing unit belongs is different from the memory sub-module to which the third physical erasing unit belongs.

Accordingly, the data writing method, the memory control circuit unit and the memory storage device of the present invention can reduce the space required for the buffer memory, and the technical effect of reading data in a plurality of memory sub-modules in parallel can be retained.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
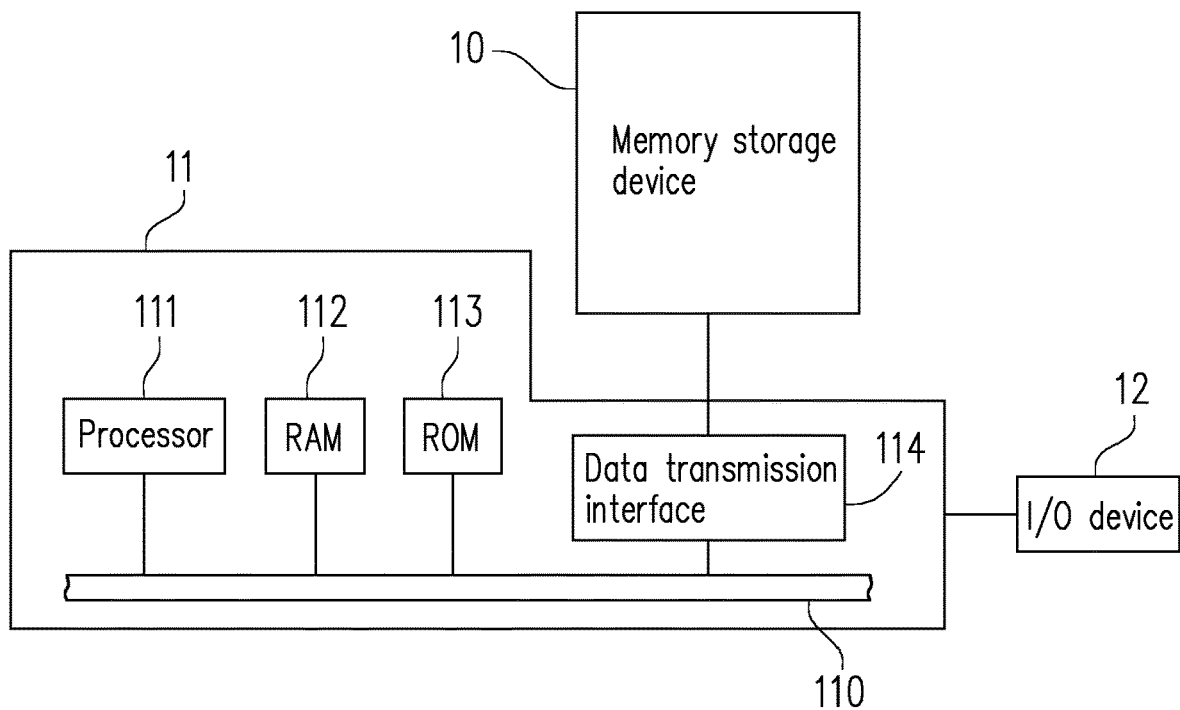
FIG. 1 is a schematic diagram illustrating a host system, a memory storage device and an I/O (input/output) device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

It is noted that in the following description, some terms may be replaced with corresponding abbreviations for ease of reading (see Table 1).

TABLE 1

| | |
|---|---|
| rewritable non-volatile memory module | RNVM module |
| physical erasing unit | PEU |
| physical programming unit | PPU |

TABLE 1-continued

| | |
|---|---|
| memory management circuit | MMC |
| memory control circuit | MCC |

Figure 2:
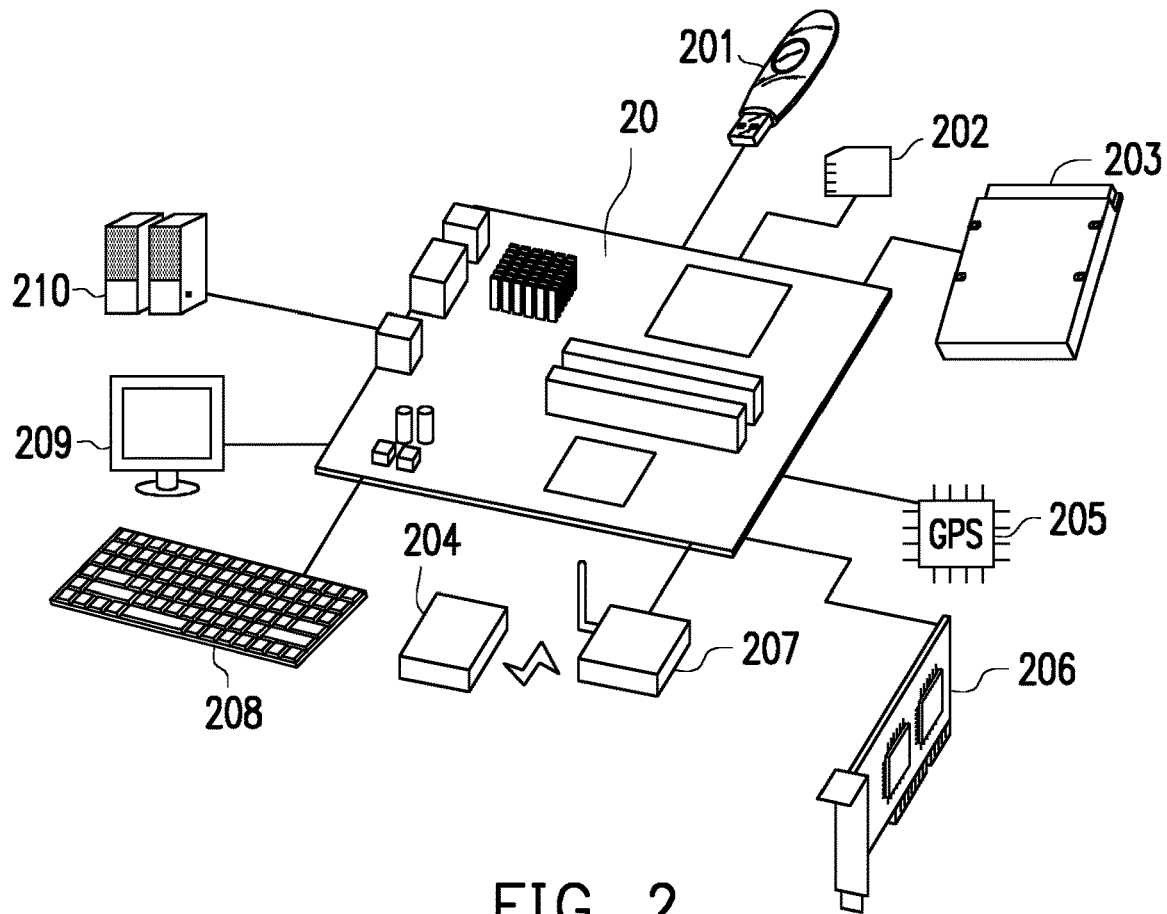
FIG. 2 is a schematic diagram illustrating a host system, a memory storage device and an I/O device according to another exemplary embodiment.

FIG. 1 is a schematic diagram illustrating a host system, a memory storage device and an I/O (input/output) device according to an exemplary embodiment. FIG. 2 is a schematic diagram illustrating a host system, a memory storage device and an I/O device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
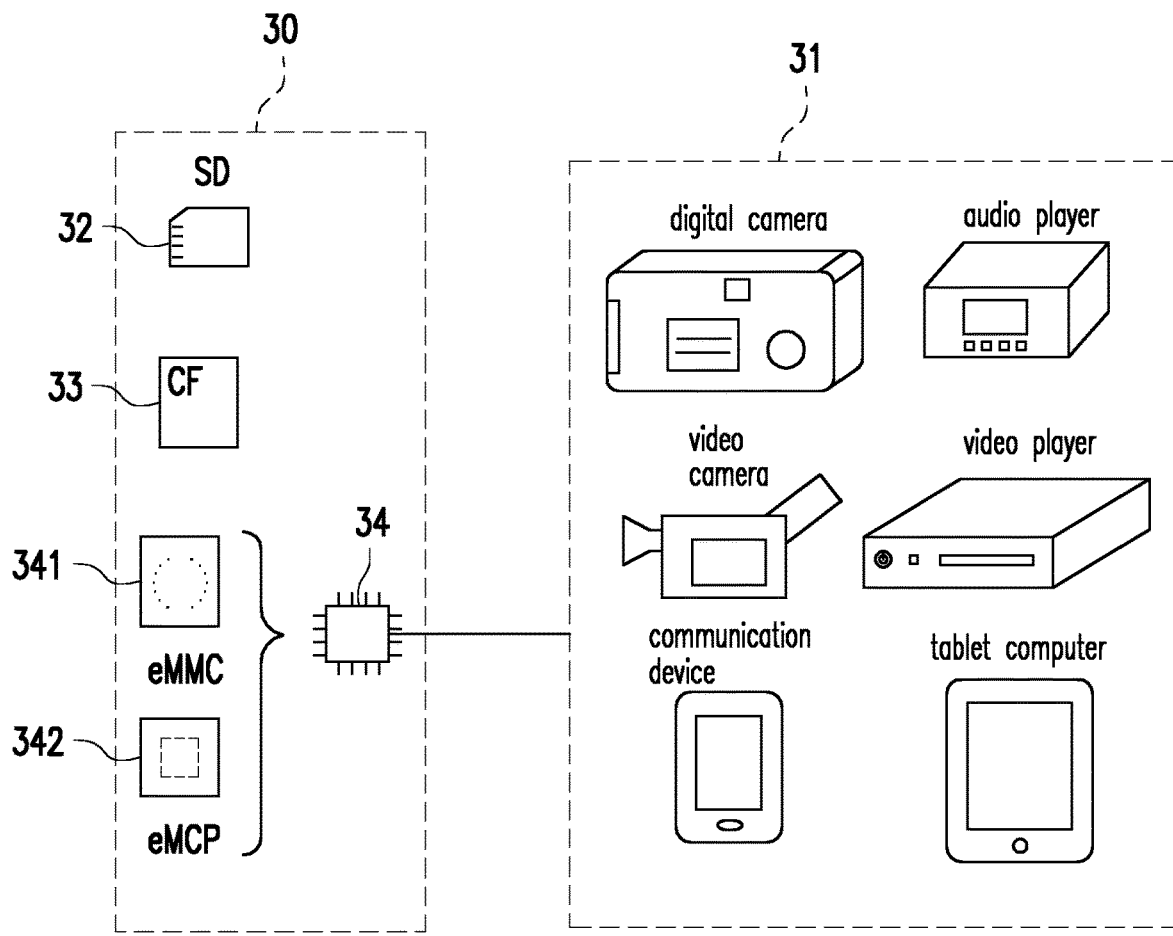
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in the foregoing exemplary embodiments, nonetheless, FIG. 3 is a schematic diagram illustrating a host system and a memory storage device according to another exemplary embodiment of the invention. Referring to FIG. 3, in another exemplary embodiment, a host system 31 may also be a system such as a digital camera, a video camera, a communication device, an audio player, a video player or a tablet computer, whereas a memory storage device 30 may be various non-volatile memory storage devices used by the host system 731, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
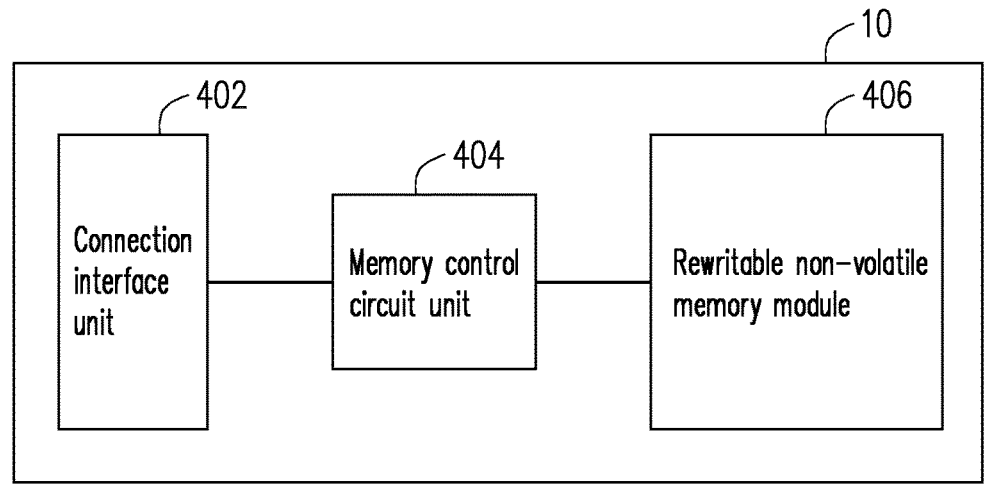
FIG. 4 is a schematic block diagram illustrating a memory storage device according to an exemplary embodiment.

FIG. 4 is a schematic block diagram illustrating a memory storage device according to an exemplary embodiment.

Referring to FIG. 4, the memory storage device 10 includes a connection interface unit 402, a MCC unit 404 and a RNVM module 406.

The connection interface unit 402 is configured to couple to the memory storage device 10 to the host system 11. In the present exemplary embodiment, the connection interface unit 402 is compatible with a PCI Express (Peripheral Component Interconnect Express) interface standard, and is also compatible with an NVM express interface standard. Specifically, the NVM express interface standard refers to a protocol for communication between the host system and the memory storage device, which defines register interface, command set and feature set between a controller of the memory storage device and an operating system of the host system and aims to improve a data access speed and a data transmission rate for the PCIe interface-based memory storage device by optimizing the interface standard of the memory storage device. However, in another exemplary embodiment, the connection interface unit 402 may also be compatible with other suitable standards. In addition, the connection interface unit 402 and the MCC unit 404 may be packaged into one chip, or the connection interface unit 402 is distributed outside of a chip containing the MCC unit 404.

The MCC unit 404 is configured to execute a plurality of logic gates or control commands which are implemented in a hardware form or in a firmware form and perform operations, such as writing, reading or erasing data in the RNVM module 406 according to the commands of the host system 11.

The RNVM module 406 is coupled to the MCC unit 404 and configured to store data written from the host system 11. The RNVM module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the RNVM module 406, one or more bits are stored by changing a voltage (a.k.a. a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". Each of the memory cells in the RNVM module 406 has a plurality of storage states depended on changes in the threshold voltage. The storage state to which the memory cell belongs may be determined by applying a read voltage to the memory cell, so as to obtain the one or more bits stored in the memory cell.

In the present exemplary embodiment, the memory cells of the RNVM module 406 constitute a plurality of PPUs, and the PPUs constitute a plurality of PEUs. Specifically, the memory cells on the same word line constitute one or more of the PPUs. If each of the memory cells can store more than one bit, the PPUs on the same word line can be at least classified into a lower PPU and an upper PPU. For instance, a least significant bit (LSB) of one memory cell belongs to the lower PPU, and a most significant bit (MSB) of one memory cell belongs to the upper PPU. Generally, in the MLC NAND flash memory, a writing speed of the lower PPU is higher than a writing speed of the upper PPU, and/or a reliability of the lower PPU is higher than a reliability of the upper PPU.

In the present exemplary embodiment, the PPU is the minimum unit for programming. That is, the PPU is the minimum unit for writing data. For example, the PPU is a physical page or a physical sector. When the PPUs are the physical page, these PPUs usually include a data bit area and a redundancy bit area. The data bit area includes multiple physical sectors configured to store user data, and the redundant bit area is configured to store system data (e.g., management data such as an error correcting code, etc.). In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the PEU is the minimum unit for erasing. Namely, each PEU contains the least number of memory cells to be erased together. For instance, the PEU is a physical block.

Figure 5:
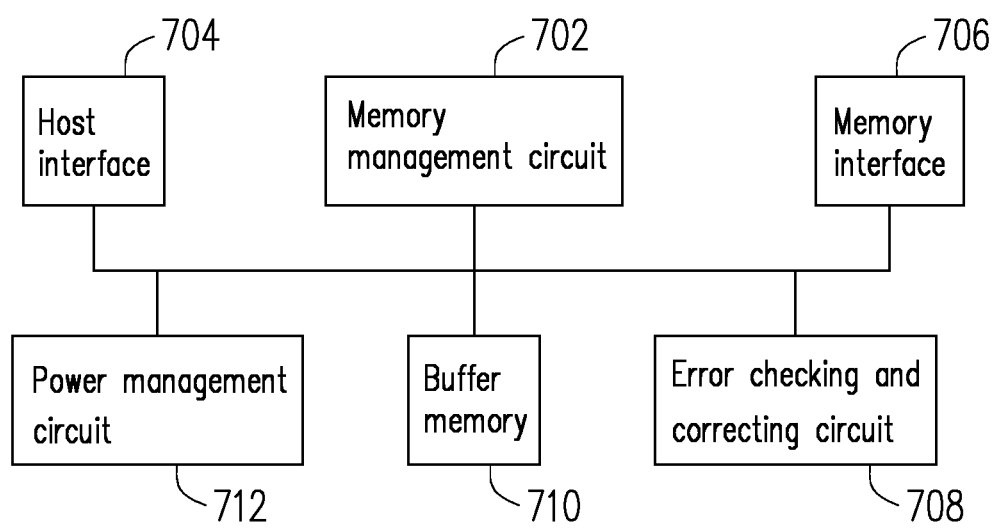
FIG. 5 is a schematic block diagram illustrating a MCC unit according to an exemplary embodiment.

FIG. 5 is a schematic block diagram illustrating a MCC unit according to an exemplary embodiment.

Referring to FIG. 5, the MCC unit 404 includes a MMC 502, a host interface 504 and a memory interface 506.

The MMC 502 is configured to control overall operations of the MCC unit 404. Specifically, the MMC 502 has a plurality of control commands and the control commands are executed to perform various operations such as writing, reading and erasing data during operation of the memory storage device 10. Hereinafter, the operations of the MMC 502 are described as equivalent to describe the operations of the MCC unit 404.

In the present exemplary embodiment, the control commands of the MMC 502 are implemented in a firmware form. For instance, the MMC 502 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the MMC 502 may also be stored as program codes in a specific area (for example, the system area in a memory exclusively used for storing system data) of the RNVM module 406. In addition, the MMC 502 has a microprocessor unit (not illustrated), the read only memory (not illustrated) and a random access memory (not illustrated). More particularly, the ROM has a boot code, which is executed by the microprocessor unit to load the control commands stored in the RNVM module 406 to the RAM of the MMC 502 when the MCC unit 404 is enabled. Then, the control commands are executed by the microprocessor unit to perform operations, such as writing, reading or erasing data.

Further, in another exemplary embodiment, the control commands of the MMC 502 may also be implemented in a hardware form. For example, the MMC 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the RNVM module 406 or a group thereof. The memory writing circuit is configured to give a write command sequence for the RNVM module 406 in order to write data into the RNVM module 406. The memory reading circuit is configured to give a read command sequence for the RNVM module 406 in order to read data from the RNVM module 406. The memory erasing circuit is configured to give an erase command sequence for the RNVM module 406 in order to erase data from the RNVM module 406. The data processing circuit is configured to process both the data to be written into the RNVM module 406 and the data read from the RNVM module 406. Each of the write command sequence, the read command sequence and the erase command sequence may include one or more program codes or command codes, and instruct the RNVM module 406 to perform the corresponding operations, such as writing, reading and erasing. In an exemplary embodiment, the MMC 502 may further give command sequence of other types to the RNVM module 406 for instructing to perform the corresponding operations.

The host interface 504 is coupled to the MMC 502 and configured to receive and identify commands and data sent from the host system 11. In other words, the commands and data transmitted by the host system 11 are transmitted to the MMC 502 via the host interface 504. In the present exemplary embodiment, the host interface 504 is compatible with the SATA standard. However, it should be understood that the invention is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the MMC 502 and configured to access the RNVM module 406. In other words, data to be written into the RNVM module 406 is converted into a format acceptable by the RNVM module 406 via the memory interface 506. Specifically, if the MMC 502 intends to access the RNVM module 406, the memory interface 506 sends corresponding command sequences. For example, the command sequences may include the write command sequence which instructs to write data, the read command sequence which instructs to read data, the erase command sequence which instructs to erase data, and other corresponding command sequences for instructing to perform various memory operations (e.g., changing read voltage levels or performing a garbage collection procedure). These command sequences are generated by the MMC 502 and transmitted to the RNVM module 406 through the memory interface 506, for example. The command sequences may include one or more signals, or data transmitted in the bus. The signals or the data may include command codes and program codes. For example, information such as identification codes and memory addresses are included in the read command sequence.

In an exemplary embodiment, the MCC unit 404 further includes an error checking and correcting circuit 508, a buffer memory 510 and a power management circuit 512.

The error checking and correcting circuit 508 is coupled to the MMC 502 and configured to perform an error checking and correcting operation to ensure the correctness of data. Specifically, when the MMC 502 receives the write command from the host system 11, the error checking and correcting circuit 508 generates an ECC (error correcting code) and/or an EDC (error detecting code) for data corresponding to the write command, and the MMC 502 writes data corresponding to the write command and the corresponding ECC and/or the EDC into the RNVM module 406. Then, when the MMC 502 reads the data from the RNVM module 406, the corresponding ECC and/or the EDC are also read, and the error checking and correcting circuit 508 performs the error checking and correcting operation on the read data based on the ECC and/or the EDC.

The buffer memory 510 is coupled to the MMC 502 and configured to temporarily store data and commands from the host system 11 or data from the RNVM module 406. The power management unit 512 is coupled to the MMC 502 and configured to control a power of the memory storage device 10.

Figure 6:
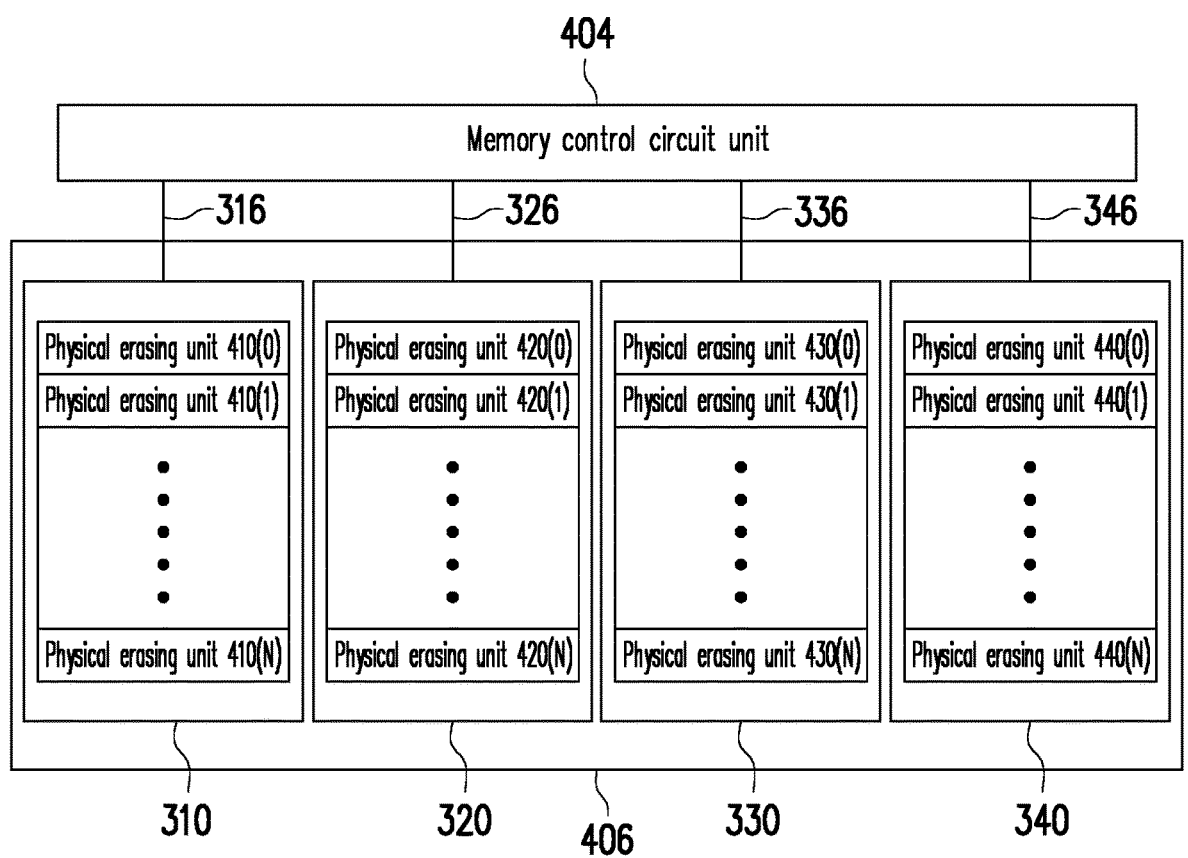
FIG. 6 is a schematic block diagram illustrating a RNVM module according to an exemplary embodiment.

FIG. 6 is a schematic block diagram illustrating a RNVM module according to an exemplary embodiment.

With reference to FIG. 6, the RNVM module 406 includes a first memory sub-module 310, a second memory sub-module 320, a third memory sub-module 330 and a fourth memory sub-module 340. For example, each of the memory sub-module 310, the second memory sub-module 320, the third memory sub-module 330 and the fourth memory sub-module 340 is a memory die. The first memory sub-module 310 includes PEUs 410(0) to 410(N). The second memory sub-module 320 includes PEUs 420(0) to 420(N). The third memory sub-module 330 includes PEUs 430(0) to 430(N). The fourth memory sub-module 340 includes PEUs 440(0) to 440(N).

For example, the first memory sub-module 310, the second memory sub-module 320, the third memory sub-module 330 and the fourth memory sub-module 340 are coupled to the MCC unit 404 respectively through independent data bus 316, data bus 326, data bus 336 and data bus 346. Accordingly, the MMC 502 can write the data into the first memory sub-module 310, the second memory sub-module 320, the third memory sub-module 330 and the fourth memory sub-module 340 respectively via the data bus 316, the data bus 326, the data bus 336 and the data bus 346 in a parallel manner.

However, it should be understood that, in another exemplary embodiment, the first memory sub-module 310, the second memory sub-module 320, the third memory sub-module 330 and the fourth memory sub-module 340 may also be coupled to the MCC unit 404 through only one data bus. Here, the MMC 502 can write the data into the first memory sub-module 310, the second memory sub-module 320, the third memory sub-module 330 and the fourth memory sub-module 340 via the single data bus in an interleave manner.

In particular, each of the first memory sub-module 310, the second memory sub-module 320, the third memory sub-module 330 and the fourth memory sub-module 340 may include a plurality of word lines, and a plurality of physical pages are formed by a plurality of memory cells on the same word line. The physical pages on the same word line may be called as a physical page group. Each PEU of the first memory sub-module 310, the second memory sub-module 320, the third memory sub-module 330 and the fourth memory sub-module 340 has multiple physical pages, and the physical pages belonging to the same PEU may be written separately and erased simultaneously. For example, each PEU is constituted by 128 physical pages. Nevertheless, it should be understood that the invention is not limited to the above. Each PEU may be constituted by 64 pages, 256 physical pages or any number of the physical pages.

More specifically, the PEU is a minimum unit for erasing. Namely, each PEU contains the least number of memory cells to be erased together. The physical page is the minimum unit for programming. That is, the physical page is the minimum unit for writing data. However, it should be understood that, in another exemplary embodiment of the invention, the minimum unit for writing data may also be a sector or other units. Each of the physical pages usually includes a data bit area and a redundant bit area. The data bit area is configured for storing the user data, and the redundant bit area is configured for storing the system data (e.g., an error checking and correcting (ECC) code). It should be noted that, in another exemplary embodiment, one physical unit may also refer to one physical address, one PPU, or a composition of a plurality of continuous or discontinuous physical addresses.

It is noted that, the exemplary embodiment of the invention is described by using the RNVM module 406 that includes four memory sub-modules as an example, but the invention is not limited thereto. In another embodiments, the RNVM module 406 may include six, eight or ten memory sub-modules.

It should be noted that, in general, if multiple memory sub-modules are to be simultaneously written, the buffer memory 510 needs more space to store data from the host system 11. For example, if the RNVM module 406 supports simultaneously (or in parallel) writing of four memory sub-modules, the buffer memory 510 needs a space with the size of four physical page groups. When the data from the host system 11 fills the space with the size of four physical page groups in the buffer memory 510, the MMC 502 may simultaneously write the data, which comes from the host system 11, from the buffer memory 510 to the four memory sub-modules. Assuming that the data is to be read, the MMC 502 can simultaneously (or in parallel) read the data from the four memory sub-modules. However, based on the reason that multiple memory sub-modules are to be simultaneously written, the above-mentioned method requires a lot of space of the buffer memory 510.

Therefore, the present invention provides a data writing method in which the buffer memory 510 requires less space (for example, the size with one physical page group) to temporarily store a plurality of data from the host system 11. When performing write operation to the RNVM module 406, the MMC 502 may writes the data, which comes from the host system 11, from the buffer memory 510 into a memory sub-module when the data from the host system 11 fills a space with the size of one physical page group in the buffer memory 510. After that, assuming that a data transfer operation (for example, a valid data merge operation or a wear-leveling operation) is to be performed, the MMC 502 will distribute the data into a plurality of different memory sub-modules. When the data is to be read, the MMC 502 can read the data from the memory sub-modules in parallel (or simultaneously).

Figure 7:
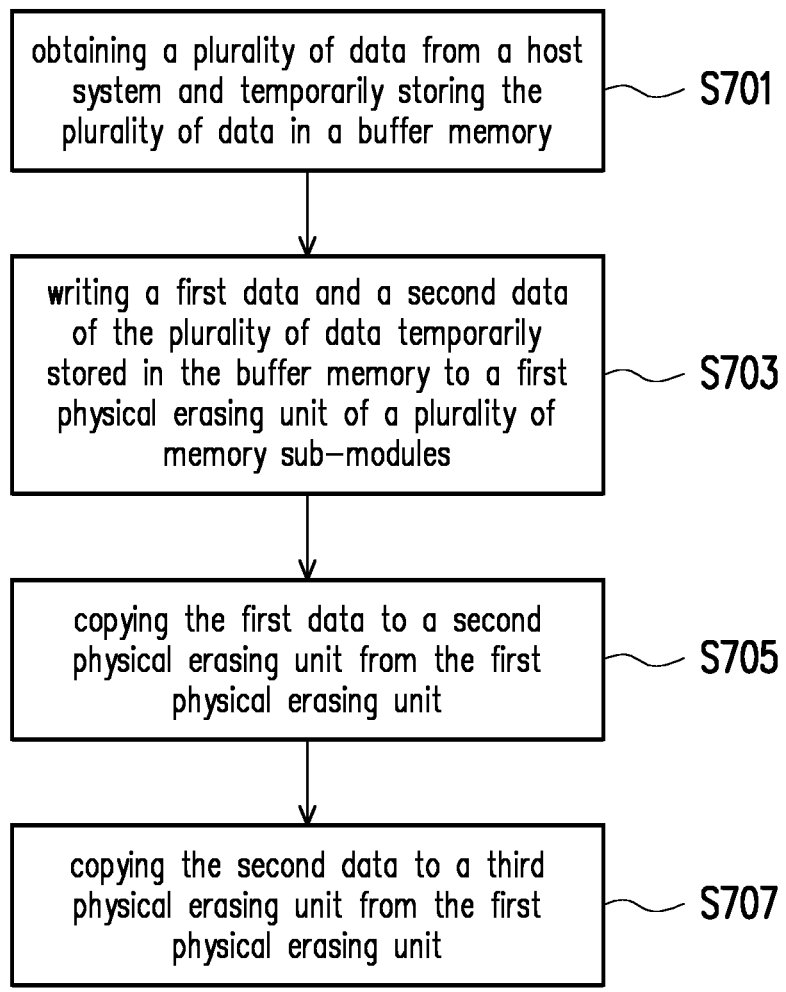
FIG. 7 is a flowchart of a data writing method according to an exemplary embodiment.

FIG. 7 is a flowchart of a data writing method according to an exemplary embodiment.

Referring to FIG. 7, in step S701, the MMC 502 obtains a plurality of data from the host system 11 and temporarily storing the plurality of data in the buffer memory 510. In step S703, the MMC 502 writes a first data and a second data of the plurality of data temporarily stored in the buffer memory 510 to a first PEU of a plurality of memory sub-modules. When performing a data transfer operation, in step S705, the MMC 502 copies the first data to a second PEU from the first PEU. In step S707, the MMC 502 copies the second data to a third PEU from the first PEU, wherein the memory sub-module to which the second PEU belongs is different from the memory sub-module to which the third PEU belongs.

With the data writing method of the present invention, the space required for the buffer memory 510 can be reduced, and the technical effect of reading data in a plurality of memory sub-modules in parallel can be retained.

The data writing process of the data writing method of the present invention will be described below in a more detailed embodiment.

First Embodiment

Figure 8A:
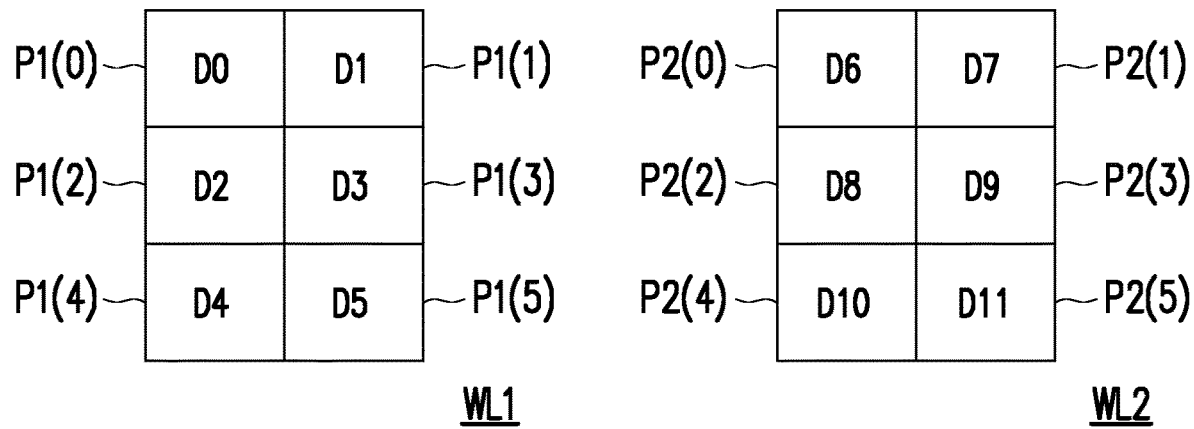
FIG. 8A to FIG. 8B are schematic diagrams illustrating an example of the data writing method according to a first embodiment of the present invention.
Figure 8B:
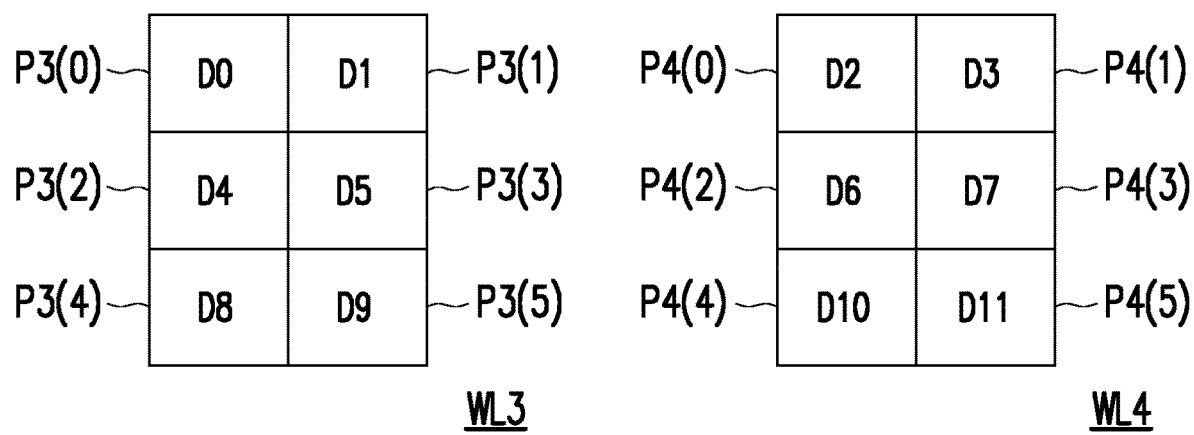

FIG. 8A to FIG. 8B are schematic diagrams illustrating an example of the data writing method according to a first embodiment of the present invention.

Referring to FIG. 8A to FIG. 8B, in the exemplary embodiment, assuming that the RNVM module 406 is a three-dimensional (3D) NAND flash memory. The memory cells on each word lines in the RNVM module 406 can form six physical pages, and six physical pages on the same word line can be called as a physical page group. As shown in FIG. 8A and FIG. 8B, the RNVM module 406 may include, for example, a word line WL1 and a word line WL2 belonging to a first memory sub-module, a word line WL3 belonging to a second memory sub-module and a word line WL4 belonging to a third memory sub-module. The memory cells on the word line WL1 form physical pages P1(0)~P1(5). The memory cells on the word line WL2 form physical pages P2(0)~P2(5). The memory cells on the word line WL3 form physical pages P3(0)~P3(5). The memory cells on the word line WL4 form physical pages P4(0)~P4(5). In the first embodiment, the word line WL1 is also referred to as "first word line", the word line WL3 is also referred to as "second word line", and the word line WL4 is also referred to as "third word line". In this embodiment, the physical pages P1(0)~P1(5) and the physical pages P2(0)~P2(5) are belonged to a PEU (also referred to as "first PEU") of the first memory sub-module. The physical pages P3(0)~P3(5) are belonged to a PEU (also referred to as "second PEU") of the second memory sub-module. The physical pages P4(0)~P4(5) are belonged to a PEU (also referred to as "third PEU") of the third memory sub-module.

It should be noted that it is assumed here that the host system 11 writes a plurality of continuous data into the RNVM module 406. The plurality of data include first data and second data. Among them, the first data includes sub-data D0 and sub-data D1, and the second data includes sub-data D2 and sub-data D3. That is to say, from the perspective of sub-data, the sequence order of sub-data is in the order of sub-data D0, sub-data D1, sub-data D2, and sub-data D3. In the first embodiment, the sub-data D0 is also referred to as "first sub-data", the sub-data D1 is also referred to as "second sub-data", the sub-data D2 is also referred to as "third sub-data", and the sub-data D3 is also referred to as "fourth sub-data". In addition, in this embodiment, it is assumed that the host system 11 also writes a plurality of sub-data D4~D11 into the RNVM module 406.

In the first embodiment, it is assumed that the buffer memory 510 uses only the size of one physical page group to store data from the host system 11. After the MMC 502 obtains the sub-data D0~D5 from the host system 11, the sub-data D0~D5 are temporarily stored in the buffer memory 510. Then, the MMC 502 obtains the sub-data D0~D5 from the buffer memory 510, and writes the sub-data D0~D5 respectively to the physical pages P1(0)~P1(5) (also referred to as "first corresponding physical pages") on the word line WL1 in the same write operation. In addition, it is assumed that the MMC 502 writes the sub-data D6~D11 respectively to the physical pages P2(0)~P2(5) on the word line WL2 in a manner similar to the foregoing. After that, the MMC 502 can mark the physical page group (also referred to as "first physical page group") composed of the physical pages P1(0)~P1(5) on the word line WL1 and the physical page group composed of the physical pages P2(0)~P2(5) on the word line WL2 by using a first bit value (for example, the value "1").

After that, referring to FIG. 8A and FIG. 8B simultaneously, when the MMC 502 is going to perform a data transfer operation, the MMC 502 can select, for example, the physical page group of the word line WL1 and the physical page group of the word line WL2 according to the first bit value described above. The MMC 502 copies the sub-data D0 and the sub-data D1 from the word line WL1, and sequentially writes the sub-data D0 and the sub-data D1 to the physical page P3(0) and the physical page P3(1) on the word line WL3 respectively. In addition, the MMC 502 also copies the sub-data D2 and the sub-data D3 from the word line WL1, and sequentially writes the sub-data D2 and the sub-data D3 to the physical page P4(0) and the physical page P4(1) on the word line WL4 respectively. In the first embodiment, the physical page P3(0) is also referred to as a "first physical page". The physical page P3(1) is also referred to as a "second physical page" The physical page P4(0) is also referred to as a "third physical page". The physical page P4(1) is also referred to as a "fourth physical page".

Similarly, when performing the data transfer operation, the MMC 502 also copies the sub-data D4 and the sub-data D5 from the word line WL1, and sequentially writes the sub-data D4 and the sub-data D5 to the physical page P3(2) and the physical page P3(3) on the word line WL3 respectively. The MMC 502 also copies the sub-data D6 and the sub-data D7 from the word line WL2, and sequentially writes the sub-data D6 and the sub-data D7 to the physical page P4(2) and the physical page P4(3) on the word line WL4 respectively. The MMC 502 also copies the sub-data D8 and the sub-data D9 from the word line WL2, and sequentially writes the sub-data D8 and the sub-data D9 to the physical page P3(4) and the physical page P3(5) on the word line WL3 respectively. The MMC 502 also copies the sub-data D10 and the sub-data D11 from the word line WL2, and sequentially writes the sub-data D10 and the sub-data D11 to the physical page P4(4) and the physical page P4(5) on the word line WL4 respectively.

After that, the MMC 502 can mark the physical page group (also referred to as a "second physical page group") composed of the physical pages P3(0)~P3(5) on the word line WL3 and the physical page group (also referred to as a "third physical page group") composed of the physical pages P4(0)~P4(5) on the word line WL4 by using a second bit value (for example, the value "0"). In this example, the physical page P3(0) and the physical page P3(1) for writing the first data (i.e., the sub-data D0 and the sub-data D0 in the word line WL3 may be collectively referred to as "second corresponding physical pages". The physical page P4(0) and the physical page P4(1) for writing the second data (i.e., the sub-data D2 and the sub-data D3) in the word line WL4 may be collectively referred to as the "third corresponding physical pages".

After that, when the MMC 502 is going to read the sub-data D0~D3, the MMC 502 can read the physical pages P3(0)~P3(1) and physical page P4(0)~P4(1) located in different memory sub-modules in parallel to obtain sub-data D0~D3.

Second Embodiment

Figure 9:
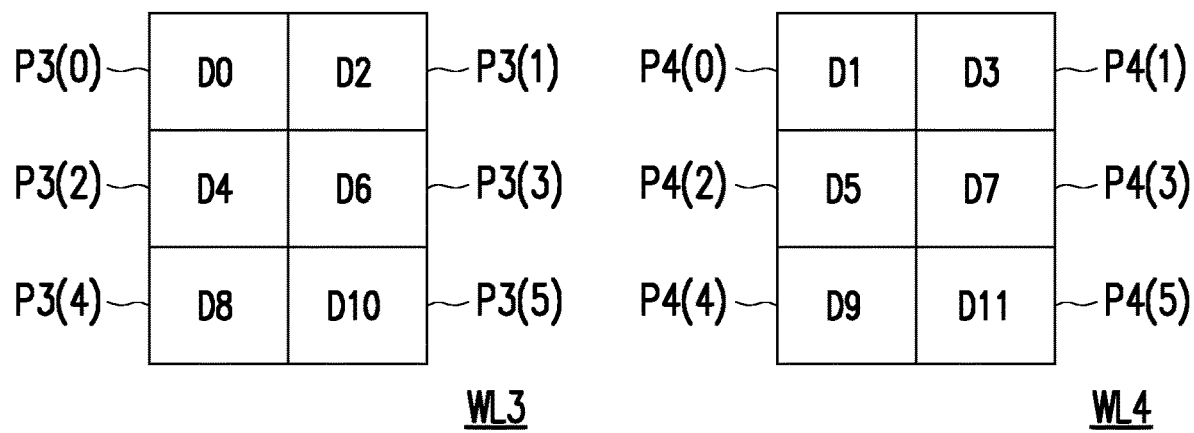
FIG. 9 is a schematic diagram illustrating an example of the data writing method according to a second embodiment of the present invention.

FIG. 9 is a schematic diagram illustrating an example of the data writing method according to a second embodiment of the present invention.

Referring to FIG. 8A and FIG. 9 simultaneously, in the present exemplary embodiment, similar to the description of the foregoing first embodiment, it is assumed here that the host system 11 writes a plurality of continuous data into the RNVM module 406. The plurality of data include first data and second data. Among them, the first data includes sub-data D0 and sub-data D2, and the second data includes sub-data D1 and sub-data D3. That is to say, from the perspective of sub-data, the sequence order of sub-data is in the order of sub-data D0, sub-data D1, sub-data D2, and sub-data D3. In the second embodiment, the sub-data D0 is also referred to as "fifth sub-data", the sub-data D1 is also referred to as "seventh sub-data", the sub-data D2 is also referred to as "sixth sub-data", and the sub-data D3 is also referred to as "eighth sub-data". In addition, in this embodiment, it is assumed that the host system 11 also writes a plurality of sub-data D4~D11 into the RNVM module 406. In this embodiment, the physical pages P1(0)~P1(5) and the physical pages P2(0)~P2(5) are belonged to a PEU (also referred to as "first PEU") of the first memory sub-module. The physical pages P3(0)~P3(5) are belonged to a PEU (also referred to as "second PEU") of the second memory sub-module. The physical pages P4(0)~P4(5) are belonged to a PEU (also referred to as "third PEU") of the third memory sub-module.

In the second embodiment, it is assumed that the buffer memory 510 uses only the size of one physical page group to store data from the host system 11. After the MMC 502 obtains the sub-data D0~D5 from the host system 11, the sub-data D0~D5 are temporarily stored in the buffer memory 510. Then, the MMC 502 obtains the sub-data D0~D5 from the buffer memory 510, and writes the sub-data D0~D5 respectively to the physical pages P1(0)~P1(5) (also referred to as "first corresponding physical pages") on the word line WL1 in the same write operation. In addition, it is assumed that the MMC 502 writes the sub-data D6~D11 respectively to the physical pages P2(0)~P2(5) on the word line WL2 in a manner similar to the foregoing. After that, the MMC 502 can mark the physical page group (also referred to as "first physical page group") composed of the physical pages P1(0)~P1(5) on the word line WL1 and the physical page group composed of the physical pages P2(0)~P2(5) on the word line WL2 by using a first bit value (for example, the value "1").

After that, referring to FIG. 8A and FIG. 9 simultaneously, when the MMC 502 is going to perform a data transfer operation, the MMC 502 can select, for example, the physical page group of the word line WL1 and the physical page group of the word line WL2 according to the first bit value described above. The MMC 502 copies the sub-data D0 and the sub-data D2 from the word line WL1, and sequentially writes the sub-data D0 and the sub-data D2 to the physical page P3(0) and the physical page P3(1) on the word line WL3 respectively. In addition, the MMC 502 also copies the sub-data D1 and the sub-data D3 from the word line WL1, and sequentially writes the sub-data D1 and the sub-data D3 to the physical page P4(0) and the physical page P4(1) on the word line WL4 respectively. In the second embodiment, the physical page P3(0) is also referred to as a "fifth physical page". The physical page P3(1) is also referred to as a "sixth physical page" The physical page P4(0) is also referred to as a "seventh physical page". The physical page P4(1) is also referred to as a "eighth physical page".

Similarly, when performing the data transfer operation, the MMC 502 also copies the sub-data D4 and the sub-data D6 from the word line WL1 and the word line WL2, and sequentially writes the sub-data D4 and the sub-data D6 to the physical page P3(2) and the physical page P3(3) on the word line WL3 respectively. The MMC 502 also copies the sub-data D5 and the sub-data D7 from the word line WL1 and the word line WL2, and sequentially writes the sub-data D5 and the sub-data D7 to the physical page P4(2) and the physical page P4(3) on the word line WL4 respectively. The MMC 502 also copies the sub-data D8 and the sub-data D10 from the word line WL2, and sequentially writes the sub-data D8 and the sub-data D10 to the physical page P3(4) and the physical page P3(5) on the word line WL3 respectively. The MMC 502 also copies the sub-data D9 and the sub-data D11 from the word line WL2, and sequentially writes the sub-data D9 and the sub-data D11 to the physical page P4(4) and the physical page P4(5) on the word line WL4 respectively.

After that, the MMC 502 can mark the physical page group (also referred to as a "second physical page group") composed of the physical pages P3(0)~P3(5) on the word line WL3 and the physical page group (also referred to as a "third physical page group") composed of the physical pages P4(0)~P4(5) on the word line WL4 by using a second bit value (for example, the value "0"). In this example, the physical page P3(0) and the physical page P3(1) for writing the first data (i.e., the sub-data D0 and the sub-data D2) in the word line WL3 may be collectively referred to as "second corresponding physical pages". The physical page P4(0) and the physical page P4(1) for writing the second data (i.e., the sub-data D1 and the sub-data D3) in the word line WL4 may be collectively referred to as "third corresponding physical pages".

After that, when the MMC 502 is going to read the sub-data D0~D3, the MMC 502 can read the physical pages P3(0)~P3(1) and physical page P4(0)~P4(1) located in different memory sub-modules in parallel to obtain sub-data D0~D3.

In summary, the data writing method, the memory control circuit unit and the memory storage device of the present invention can reduce the space required for the buffer memory, and the technical effect of reading data in a plurality of memory sub-modules in parallel can be retained.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A data writing method for a rewritable non-volatile memory module, the rewritable non-volatile memory module includes a plurality of memory sub-modules, each of the plurality of memory sub-modules includes a plurality of physical erasing units, the data writing method comprising:
   obtaining a plurality of data from a host system and temporarily storing the plurality of data in a buffer memory;
   writing a first data and a second data of the plurality of data temporarily stored in the buffer memory to a first physical erasing unit of the plurality of memory sub-modules;
   copying the first data to a second physical erasing unit from the first physical erasing unit;
   copying the second data to a third physical erasing unit from the first physical erasing unit;
   marking a first physical page group in the first physical erasing unit for storing the first data and the second data by using a first bit value;
   marking a second physical page group in the second physical erasing unit for storing the first data by using a second bit value; and
   marking a third physical page group in the third physical erasing unit for storing the second data by using the second bit value,
   wherein the memory sub-module to which the second physical erasing unit belongs is different from the memory sub-module to which the third physical erasing unit belongs.

2. The data writing method of claim 1, wherein the plurality of memory sub-modules are respectively connected to a memory control circuit unit through a plurality of channels, wherein the memory control circuit unit reads the plurality of memory sub-modules in parallel by using the plurality of channels.

3. The data writing method of claim 1, wherein in the step of writing the first data and the second data of the plurality of data temporarily stored in the buffer memory to the first physical erasing unit of the plurality of memory sub-modules,
   the writing of the first data and the writing of the second data are completed in the same write operation.

4. The data writing method of claim 1, wherein the plurality of data are arranged in a sequence order in the host system, the first data includes a first sub-data and a second sub-data, the second data includes a third sub-data and a fourth sub-data,
   wherein the step of copying the first data to the second physical erasing unit from the first physical erasing unit includes:
   writing the first sub-data and the second sub-data respectively to a first physical page and a second physical page in the second physical erasing unit,
   wherein the step of copying the second data to the third physical erasing unit from the first physical erasing unit includes:
   writing the third sub-data and the fourth sub-data respectively to a third physical page and a fourth physical page in the third physical erasing unit,
   wherein in the sequence order of the plurality of data, the first sub-data and the second sub-data are continuous, the second sub-data and the third sub-data are continuous, and the third sub-data and the fourth sub-data are continuous.

5. The data writing method of claim 1, wherein the plurality of data are arranged in a sequence order in the host system, the first data includes a fifth sub-data and a sixth sub-data, the second data includes a seventh sub-data and a eighth sub-data,
   wherein the step of copying the first data to the second physical erasing unit from the first physical erasing unit includes:
   writing the fifth sub-data and the sixth sub-data respectively to a fifth physical page and a sixth physical page in the second physical erasing unit, wherein the step of copying the second data to the third physical erasing unit from the first physical erasing unit includes:

writing the seventh sub-data and the eighth sub-data respectively to a seventh physical page and a eighth physical page in the third physical erasing unit, wherein in the sequence order of the plurality of data, the fifth sub-data and the seventh sub-data are continuous, the sixth sub-data and the seventh sub-data are continuous, and the sixth sub-data and the eighth sub-data are continuous.

6. The data writing method of claim 1, further comprising:
performing the step of copying the first data to the second physical erasing unit from the first physical erasing unit and the step of copying the second data to the third physical erasing unit from the first physical erasing unit when performing a valid data merge operation and an wear-leveling operation.

7. A memory control circuit unit for controlling a rewritable non-volatile memory module, the rewritable non-volatile memory module includes a plurality of memory sub-modules, each of the plurality of memory sub-modules includes a plurality of physical erasing units, the memory control circuit unit comprising:

a host interface configured to couple to a host system;

a memory interface configured to couple to the rewritable non-volatile memory module, and the plurality of memory sub-modules are respectively coupled to the memory interface;

a memory management circuit coupled to the host interface and the memory interface, wherein the memory management circuit is configured to obtain a plurality of data from the host system and temporarily storing the plurality of data in a buffer memory, wherein the memory management circuit is further configured to write a first data and a second data of the plurality of data temporarily stored in the buffer memory to a first physical erasing unit of the plurality of memory sub-modules, wherein the memory management circuit is further configured to copy the first data to a second physical erasing unit from the first physical erasing unit, wherein the memory management circuit is further configured to copy the second data to a third physical erasing unit from the first physical erasing unit, wherein the memory management circuit is further configured to mark a first physical page group in the first physical erasing unit for storing the first data and the second data by using a first bit value, wherein the memory management circuit is further configured to mark a second physical page group in the second physical erasing unit for storing the first data by using a second bit value, wherein the memory management circuit is further configured to mark a third physical page group in the third physical erasing unit for storing the second data by using the second bit value, wherein the memory sub-module to which the second physical erasing unit belongs is different from the memory sub-module to which the third physical erasing unit belongs.

8. The memory control circuit unit according to claim 7, wherein the plurality of memory sub-modules are respectively connected to the memory management circuit through a plurality of channels, wherein the memory management circuit reads the plurality of memory sub-modules in parallel by using the plurality of channels.

9. The memory control circuit unit of claim 7, wherein in the operation of writing the first data and the second data of the plurality of data temporarily stored in the buffer memory to the first physical erasing unit of the plurality of memory sub-modules, the writing of the first data and the writing of the second data are completed in the same write operation.

10. The memory control circuit unit of claim 7, wherein the plurality of data are arranged in a sequence order in the host system, the first data includes a first sub-data and a second sub-data, the second data includes a third sub-data and a fourth sub-data, wherein in the operation of copying the first data to the second physical erasing unit from the first physical erasing unit, the memory management circuit is further configured to write the first sub-data and the second sub-data respectively to a first physical page and a second physical page in the second physical erasing unit, wherein in the operation of copying the second data to the third physical erasing unit from the first physical erasing unit, the memory management circuit is further configured to write the third sub-data and the fourth sub-data respectively to a third physical page and a fourth physical page in the third physical erasing unit, wherein in the sequence order of the plurality of data, the first sub-data and the second sub-data are continuous, the second sub-data and the third sub-data are continuous, and the third sub-data and the fourth sub-data are continuous.

11. The memory control circuit unit of claim 7, wherein the plurality of data are arranged in a sequence order in the host system, the first data includes a fifth sub-data and a sixth sub-data, the second data includes a seventh sub-data and a eighth sub-data, wherein in the operation of copying the first data to the second physical erasing unit from the first physical erasing unit, the memory management circuit is further configured to write the fifth sub-data and the sixth sub-data respectively to a fifth physical page and a sixth physical page in the second physical erasing unit, wherein in the operation of copying the second data to the third physical erasing unit from the first physical erasing unit, the memory management circuit is further configured to write the seventh sub-data and the eighth sub-data respectively to a seventh physical page and a eighth physical page in the third physical erasing unit, wherein in the sequence order of the plurality of data, the fifth sub-data and the seventh sub-data are continuous, the sixth sub-data and the seventh sub-data are continuous, and the sixth sub-data and the eighth sub-data are continuous.

12. The memory control circuit unit of claim 7, wherein the memory management circuit is further configured to perform the step of copying the first data to the second physical erasing unit from the first physical erasing unit and the step of copying the second data to the third physical erasing unit from the first physical erasing unit when performing a valid data merge operation and an wear-leveling operation.

13. A memory storage device, comprising:
- a connection interface unit configured to couple to a host system;
- a rewritable non-volatile memory module, wherein the rewritable non-volatile memory module includes a plurality of memory sub-modules, each of the plurality of memory sub-modules includes a plurality of physical erasing units; and
- a memory control circuit unit, coupled to the connection interface unit and the rewritable non-volatile memory module, the plurality of memory sub-modules respectively coupled to the memory control circuit unit,
- wherein the memory control circuit unit is configured to obtain a plurality of data from the host system and temporarily storing the plurality of data in a buffer memory,
- wherein the memory control circuit unit is further configured to write a first data and a second data of the plurality of data temporarily stored in the buffer memory to a first physical erasing unit of the plurality of memory sub-modules,
- wherein the memory control circuit unit is further configured to copy the first data to a second physical erasing unit from the first physical erasing unit,
- wherein the memory control circuit unit is further configured to copy the second data to a third physical erasing unit from the first physical erasing unit,
- wherein the memory sub-module to which the second physical erasing unit belongs is different from the memory sub-module to which the third physical erasing unit belongs,
- wherein the memory control circuit unit is further configured to mark a first physical page group in the first physical erasing unit for storing the first data and the second data by using a first bit value,
- wherein the memory control circuit unit is further configured to mark a second physical page group in the second physical erasing unit for storing the first data by using a second bit value, and
- wherein the memory control circuit unit is further configured to mark a third physical page group in the third physical erasing unit for storing the second data by using the second bit value.

14. The memory storage device of claim 13, wherein the plurality of memory sub-modules are respectively connected to a memory control circuit unit through a plurality of channels, wherein the memory control circuit unit reads the plurality of memory sub-modules in parallel by using the plurality of channels.

15. The memory storage device of claim 13, wherein in the operation of writing the first data and the second data of the plurality of data temporarily stored in the buffer memory to the first physical erasing unit of the plurality of memory sub-modules,
- the writing of the first data and the writing of the second data are completed in the same write operation.

16. The memory storage device of claim 13, wherein the plurality of data are arranged in a sequence order in the host system, the first data includes a first sub-data and a second sub-data, the second data includes a third sub-data and a fourth sub-data,
- wherein in the operation of copying the first data to the second physical erasing unit from the first physical erasing unit,
- the memory control circuit unit is further configured to write the first sub-data and the second sub-data respectively to a first physical page and a second physical page in the second physical erasing unit,
- wherein in the operation of copying the second data to the third physical erasing unit from the first physical erasing unit,
- the memory control circuit unit is further configured to write the third sub-data and the fourth sub-data respectively to a third physical page and a fourth physical page in the third physical erasing unit,
- wherein in the sequence order of the plurality of data, the first sub-data and the second sub-data are continuous, the second sub-data and the third sub-data are continuous, and the third sub-data and the fourth sub-data are continuous.

17. The memory storage device of claim 13, wherein the plurality of data are arranged in a sequence order in the host system, the first data includes a fifth sub-data and a sixth sub-data, the second data includes a seventh sub-data and a eighth sub-data,
- wherein in the operation of copying the first data to the second physical erasing unit from the first physical erasing unit,
- the memory control circuit unit is further configured to write the fifth sub-data and the sixth sub-data respectively to a fifth physical page and a sixth physical page in the second physical erasing unit,
- wherein in the operation of copying the second data to the third physical erasing unit from the first physical erasing unit,
- the memory control circuit unit is further configured to write the seventh sub-data and the eighth sub-data respectively to a seventh physical page and a eighth physical page in the third physical erasing unit,
- wherein in the sequence order of the plurality of data, the fifth sub-data and the seventh sub-data are continuous, the sixth sub-data and the seventh sub-data are continuous, and the sixth sub-data and the eighth sub-data are continuous.

18. The memory storage device of claim 13, wherein
- the memory control circuit unit is further configured to perform the step of copying the first data to the second physical erasing unit from the first physical erasing unit and the step of copying the second data to the third physical erasing unit from the first physical erasing unit when performing a valid data merge operation and an wear-leveling operation.

* * * * *